(12) United States Patent
Trudel et al.

(10) Patent No.: US 10,439,394 B2
(45) Date of Patent: Oct. 8, 2019

(54) POWER CONTROL DEVICE

(71) Applicant: BIPCO-SOFT R3 INC., St-Michael (BB)

(72) Inventors: Gilles Trudel, Anjou (CA); Simon Jasmin, Montréal (CA); Irène Normandin, Sherbrooke (CA)

(73) Assignee: BIPCO-SOFT R3 INC., St. Michel (BB)

( * ) Notice: Subject to any disclaimer, the term of this patent is extended or adjusted under 35 U.S.C. 154(b) by 404 days.

(21) Appl. No.: 14/404,883

(22) PCT Filed: May 31, 2013

(86) PCT No.: PCT/CA2013/000538
§ 371 (c)(1),
(2) Date: Dec. 1, 2014

(87) PCT Pub. No.: WO2013/177689
PCT Pub. Date: Dec. 5, 2013

(65) Prior Publication Data
US 2015/0244172 A1    Aug. 27, 2015

Related U.S. Application Data

(63) Continuation-in-part of application No. 13/682,824, filed on Nov. 21, 2012.

(30) Foreign Application Priority Data

Jun. 1, 2012    (CA) ...................................... 2778345
Mar. 21, 2013   (CA) ...................................... 2809896

(51) Int. Cl.
*H02J 3/14*     (2006.01)
*H01H 83/00*    (2006.01)
(Continued)

(52) U.S. Cl.
CPC ................ *H02J 3/12* (2013.01); *G01R 31/42* (2013.01); *H02J 3/14* (2013.01);
(Continued)

(58) Field of Classification Search
USPC ..................................................... 307/39, 129
See application file for complete search history.

(56) References Cited

U.S. PATENT DOCUMENTS 4,130,874 A    12/1978  Pai
4,215,394 A    7/1980   Galloway et al.
(Continued)

FOREIGN PATENT DOCUMENTS

CA    2520765 A1    12/2004
CA    2791889 A1    12/2004
(Continued)

OTHER PUBLICATIONS

Jul. 14, 2015—(US) Restriction Requirement U.S. Appl. No. 13/682,824.
(Continued)

*Primary Examiner* — Rexford N Barnie
*Assistant Examiner* — Dru Parries
(74) *Attorney, Agent, or Firm* — Banner & Witcoff, Ltd.

(57) ABSTRACT

A power control device for use in an AC power grid for regulating an electrical power a load that is supplied by the AC power grid consumes. The power control device has a frequency sensing functional block for detecting a rate of deviation of the grid frequency from a nominal grid frequency and a logic functional block for performing a load shedding process during which the power the load consumes is reduced. The load shedding process is characterized by parameters, the logic functional block controlling one or more parameters of the load shedding process at least in part on the basis of the rate of deviation of the grid frequency.

11 Claims, 12 Drawing Sheets

(51) Int. Cl.
*H02J 3/12* (2006.01)
*G01R 31/42* (2006.01)

(52) U.S. Cl.
CPC ..... *H02J 2003/143* (2013.01); *Y02B 70/3225* (2013.01); *Y02B 70/3266* (2013.01); *Y04S 20/222* (2013.01); *Y04S 20/224* (2013.01); *Y04S 20/242* (2013.01); *Y10T 307/406* (2015.04); *Y10T 307/852* (2015.04)

(56) References Cited

U.S. PATENT DOCUMENTS

| | | | |
|---|---|---|---|
| 4,308,465 | A | 12/1981 | Lafuze |
| 4,317,049 | A | 2/1982 | Schweppe |
| 4,359,644 | A | 11/1982 | Foord |
| 4,409,491 | A | 10/1983 | Schott |
| 4,419,665 | A | 12/1983 | Gurr et al. |
| 4,471,232 | A | 9/1984 | Peddie et al. |
| 4,626,698 | A | 12/1986 | Harnden, Jr. et al. |
| 4,674,031 | A | 6/1987 | Siska, Jr. |
| 4,847,781 | A | 7/1989 | Brown, III et al. |
| 5,191,520 | A | 3/1993 | Eckersley |
| 5,424,903 | A | 6/1995 | Schreiber |
| 5,442,335 | A | 8/1995 | Cantin et al. |
| 6,489,834 | B2 | 12/2002 | Naffziger et al. |
| 6,490,448 | B1 | 12/2002 | Hogberg et al. |
| 6,633,823 | B2 | 10/2003 | Bartone et al. |
| 7,010,363 | B2 | 3/2006 | Donnelly et al. |
| 7,149,605 | B2 | 12/2006 | Chassin et al. |
| 7,420,293 | B2 | 9/2008 | Donnelly et al. |
| 7,464,551 | B2 | 12/2008 | Althaus et al. |
| 7,595,613 | B2 | 9/2009 | Thompson et al. |
| 7,702,424 | B2 | 4/2010 | Cannon et al. |
| 7,830,037 | B2 | 11/2010 | Hirst |
| 7,925,597 | B2 | 4/2011 | Takano et al. |
| 8,073,573 | B2 | 12/2011 | Chassin et al. |
| 8,183,826 | B2 | 5/2012 | Tuffner et al. |
| 8,204,632 | B2 | 6/2012 | Abi-Samra |
| 8,319,599 | B2 | 11/2012 | Aisa et al. |
| 8,396,607 | B2 | 3/2013 | Hirst |
| 8,478,452 | B2 | 7/2013 | Pratt et al. |
| 8,558,511 | B2 | 10/2013 | Hammerstrom |
| 8,590,802 | B2 | 11/2013 | Hammerstrom |
| 8,600,573 | B2 | 12/2013 | Black et al. |
| 8,700,225 | B2 | 4/2014 | Pratt et al. |
| 2003/0230935 | A1 | 12/2003 | Radley |
| 2007/0198133 | A1 | 8/2007 | Hirst |
| 2007/0213880 | A1 | 9/2007 | Ehlers |
| 2007/0222294 | A1 | 9/2007 | Tsukida et al. |
| 2009/0319415 | A1 | 12/2009 | Stoilov et al. |
| 2010/0070103 | A1 | 3/2010 | Fleck et al. |
| 2010/0141463 | A1 | 6/2010 | Schweitzer, III |
| 2010/0218006 | A1 | 8/2010 | Boss et al. |
| 2010/0219808 | A1 | 9/2010 | Steckley et al. |
| 2010/0244563 | A1 | 9/2010 | Fleck |
| 2010/0292855 | A1 | 11/2010 | Kintner-Meyer |
| 2011/0147360 | A1 | 6/2011 | Hammerstrom |
| 2011/0270452 | A1 | 11/2011 | Lu et al. |
| 2012/0200160 | A1 | 8/2012 | Pratt et al. |
| 2013/0015663 | A1 | 1/2013 | Kumula et al. |
| 2013/0268132 | A1 | 10/2013 | Pratt et al. |
| 2013/0274945 | A1 | 10/2013 | Ganu et al. |
| 2013/0282181 | A1 | 10/2013 | Lu et al. |
| 2014/0037275 | A1 | 2/2014 | Flohr |

FOREIGN PATENT DOCUMENTS

| | | |
|---|---|---|
| DE | 4020294 A1 | 1/1992 |
| GB | 2361118 A | 10/2001 |
| GB | 2407440 A | 4/2005 |
| GB | 2426878 A | 12/2006 |
| JP | 2002300725 A | 10/2002 |
| WO | 9406191 A1 | 3/1994 |
| WO | 9726696 A1 | 7/1997 |
| WO | 2005029670 A1 | 3/2005 |
| WO | 2013010266 A1 | 1/2013 |

OTHER PUBLICATIONS

Feb 2, 2016 (US) Office Action U.S. Appl. No. 13/682,824.
Jul. 23, 2015—(CA) Examiner's Report—Appln 2809896.
Jun. 23, 2015—(CA) Examiner's Report—Appln 2817822.
Jul. 6, 2015—(CA) Examiner's Report—Appln 2856433.
Feb. 2, 2016—(EP) Extended Search Report—App 13796465.6.
Aisa, Valerio, "Introduction to wrap technology, a very low cost communication technology for connecting household appliances at zero cost", http://www.slideshare.net/vaisa1/introduction-to-wrap-technology-october-2010, Jul. 9, 2011.
Renewable Energy Focus, "Indesit RLtec and npower dynamic demand smart grid technology", http://www.renewableenergyfocus.com/view/5041/indesit-ritec-and-npower-dynamic-demand-smart-grid-technology/, Nov. 5, 2009.
Anslow, Mark, "How smart fridges could slash UK CO2 emissions and help renewables", http://www.theguardian.com/environment/2009/apr/27/carbon-emissions-smart-fridges-environmentally-friendly-appliances, Apr. 28, 2009.
Johal, Harjeet et al., "Supporting Cold Load Pickup with Demand Response, Appliances National Town Hall Meeting on Demand Response and Smart Grid", Jul. 13, 2011 http://billstron.com/documents/Harjeet%20Johal%20%28GE%29%20-%20NAP%20Tech.pdf.
Flohr, Daniel, "Making the Case for Grid-Interactive Electric Water Heating in 2014, Frequency Regulation: "The Holy Grail"", 15th PLMA Spring Conference, Apr. 14, 2014, http://c.ymcdn.com/sites/www.peakload.org/resource/resmgr/2014_GIWH_Workshop/Flohr.pdf.
Open Energi, "CERT Final Report", May 2, 2012, 67 pages.
Open Energi. "Demand Response Market Overview V1", http://www.openenergi.com/downloads/OE%20Demand%20Response%20Market%20Overview%20V1.pdf, Apr. 2013, 7 pages.
US Department of Energy, "Benefits of Demand Response in Electricity Markets and Recommendations for Achieving Them. A Report to Congress Pursuant to Section 1252 of the Energy Policy Act of 2005"; Feb. 2006, 122 pages.
Agyeman, Constance et al., "Dynamic Demand Challenge". Centre for Challenge Prizes, Jun. 2014, 32 pages.
Ricci, A. et al., "Power-Grid Load Balancing by Using Smart Home Appliances", Consumer Electronics, Digest of Technical Papers. International Conference, Jan. 9-13, 2008, © 2008 IEEE, 2 pagss.
Dynamic Demand, http://www.dynamicdemand.co.uk/index.htm, page consulted on Aug. 25, 2014.
International Search Report dated Sep. 19, 2013, in connection with International Patent Application PCT/CA2013/000538, 6 pages.
Written Opinion of the International Searching Authority dated Sep. 19, 2013, in connection with International Patent Application PCT/CA2013/000538, 7 pages.
Grid FriendlyTM Applicance Projet, Pacific Northwest GridWiseTM tested Demonstration Project, PNNL-17079, Oct. 2007, 123 pages.
PowerCentsDCTM Program Interim Report, Power Cents DC, Nov. 2009, 52 pages.
Examiner's Report dated Oct. 3, 2012 in connection with Canadian Patent Application 2,778,345, 3 pages.
Examiner's Report dated Jul. 9, 2013 in connection with Canadian Patent Application 2,809,896, 5 pages.
Examiner's Report dated Dec. 4, 2013 in connection with Canadian Patent Application 2,809,896, 4 pages.
Examiner's Report dated Jul. 29, 2013 in connection with Canadian Patent Application 2,817,822, 4 pages.
Notice of allowance dated Feb. 7, 2014 in connection with Canadian Patent Application 2,817,822, 1 page.
Examiner's Report dated Aug. 25, 2014 in connection with Canadian Patent Application 2,856,433, 3 pages.
U.S. Appl. No. 13/682,824, filed Nov. 21, 2012, Giles Trudel et al.
Jun. 29, 2018—(US) Office Action—U.S. Appl. No. 15/385,474.

POWER CONTROL DEVICE

CROSS-REFERENCE TO RELATED APPLICATIONS

The present application is a U.S. National Phase of International Application No. PCT/CA2013/000538, filed on May 31, 2013, designating the United States of America and claiming priority to Canadian Patent Application No. 2,778,345, filed Jun. 1, 2012 and Canadian Patent Application No. 2,809,896, filed Mar. 21, 2013. The present application is further a Continuation-in Part of U.S. patent application Ser. No. 13/682824, filed Nov. 21. 2012, and claims priority to and the benefit of the above-identified applications, each of which is incorporated by reference herein in its entirety.

FIELD OF THE INVENTION

The present invention relates to a controller for controlling the electrical power transferred between an AC power grid and an external device that is the electrical power consumed by a load connected to the power grid or injected in the power grid from a supplemental energy source. The invention also extends to control strategies for such power transfer functions. In a specific and non-limiting example of implementation, the invention can be used to improve the power grid frequency stability.

BACKGROUND OF THE INVENTION

To ensure the reliability of an electric power grid, the operator continually maintains a power reserve to compensate for a possible failure of electrical generation units. The power reserve is essentially an excess production capacity on standby. In normal conditions, the power generation units are run at less than 100% such that a degree of reserve power is always available. However, the maintenance of this reserve capacity is an expensive proposition since the reserve constitutes a resource that cannot be effectively monetized by the utility company.

An AC power grid will operate in normal conditions at a fixed frequency (usually 50 or 60 Hz). The frequency remains constant as long as the supplied power matches the power consumed by the load. Any sudden changes in generation or load resulting in an imbalance between generation and load will lead to a frequency instability during which the frequency deviates from its nominal value. Large frequency variations are undesirable because they could lead to equipment trip or even a system collapse.

Frequency instability events are generally caused by the sudden loss of an electrical generation unit or by the loss of a large load and are characterized by a sudden frequency variation from the frequency nominal value.

The reserve capacity in a power grid is thus tapped when the frequency drops below a certain level. Electrical generation units that supply power to the grid are equipped with a speed governor. The speed governor continuously regulates the power output of generation units to balance the generation with the load. Thus, when the frequency of the power grid varies, the speed governor responds to this variation to compensate it. For example, when the frequency is higher than normal, the speed governor will simply lower the power generated by the generation unit (therefore reducing the amount of power supplied to the grid). Alternatively, when the frequency is lower than normal, the speed governor will increase the power generation. The speed governor however has some inherent limitations. In particular, it is slow to respond since it involves certain mechanical constraints. Depending of the type of generation (hydraulic, gas, thermal, wind, etc. . . . ), some time is required for the generation unit to increase its speed up to the desired point.

System inertia is another aspect to frequency stability of the AC power grid. "Inertia" refers to the ability of the grid to buffer imbalances, such as excess power generation or power generation deficit and thus prevent significant and rapid frequency excursions. Any AC power grid has a level of inherent inertia. This inherent inertia effect is the result of the energy stored in the AC power grid that builds up or bleeds off to buffer the imbalance, depending on whether the imbalance is the result of an excess or deficit of power generation. Most of this energy is the kinetic energy of the power generators and other rotating masses. When the AC power grid experiences a significant imbalance due to a power generation deficit, the kinetic energy will be tapped and converted in electricity to feed the load, thus compensating temporarily the power generation deficit. As the kinetic energy bleeds off, the power generators and other rotating masses will slow down causing the frequency to deviate from its nominal value. The rate of deviation of the frequency is thus dependent on the rate of kinetic energy depletion.

Accordingly, from the perspective of frequency stability, some level of inertia in the power grid is desirable because it acts as a mechanism to dampen frequency variations and thus provides more time for slower frequency stabilization systems to become active.

SUMMARY OF THE INVENTION

According to a first broad aspect, the invention provides a power control device for regulating the power that a load consumes, on the basis of the AC supply frequency. The system includes decision logic that responds to a frequency deviation to implement a power regulation process. The power regulation process reduces the power the load consumes in a continuous fashion with relation to the degree of deviation of the grid frequency from the nominal frequency.

In a specific and nonlimiting example of implementation, the power control device operates independently without external control input other than the AC frequency. This makes the installation and deployment of the system simple since there is no need to install a dedicated communication channel to carry commands to the device.

The power control device can be coupled to a household appliance to regulate its power consumption. Examples of such household appliances include resistive heating devices such as water heaters, air heating systems and clothes dryers, among others. Resistive loads allow a continuous form of power regulation during which electrical power that the appliance consumes is adjusted by a degree that matches the level at which the AC frequency has deviated. Thus, when a power reduction is being implemented, such power reduction does not completely negate the functionality of the appliance. For instance, in the case of a water heater, water will still be heated albeit at a lower rate.

Power regulation performed in a continuous fashion is to be distinguished from a binary form of control where power to the load is completely cut off during a power reduction and then instantly and fully turned on during the power restoration. During continuous power regulation, the power the load is allowed to consume is varied in a gradual and non-stepwise fashion.

A variant of the continuous power regulation approach is to perform power regulation including multiple discrete steps. The discrete steps include a full power step where the load is allowed to consume its nominal amount of power and a no power step were no electrical power is supplied to the load and one or more intermediate steps where intermediate levels of electrical power are supplied to the load. The number of intermediate power steps can vary depending on the intended application, but at least one is required.

By installing the power control device in a large number of individual dwellings supplied by the power grid, an aggregate control effect can be achieved to provide meaningful frequency stabilization.

Under the first broad aspect, the invention thus provides a power control device for use in an AC power grid for regulating an electrical power at a load that is supplied by the AC power grid consumes. The power control device has a frequency sensing functional block for detecting deviations of the grid frequency from a nominal grid frequency and a logic functional block for implementing a power regulation process. During the power regulation process, the power the load consumes is reduced when the frequency sensing functional block determines that the grid frequency has deviated from the nominal grid frequency. The power the load consumes is reduced in a continuous fashion with relation to the degree of deviation of the grid frequency from the nominal frequency.

Under the first broad aspect, the invention also provides a power control device for use in an AC power grid for regulating the electrical power a load that is supplied by the AC power grid consumes. The power control device has a sensing functional block for detecting a frequency instability event within the grid and a logic functional block for implementing a power regulation process during which the power the load consumes is reduced when the sensing functional block determines that frequency instability is occurring. The power regulation process reduces the power the load consumes in a continuous fashion with relation to a degree of frequency instability.

Under the first broad aspect, the invention further provides a method for regulating an amount of power a load connected to an AC power grid is allowed to consume. The method includes detecting deviations of a frequency of the AC power grid from a nominal grid frequency via a power supply connection between the load and the AC power grid and reducing the power the load consumes in a continuous fashion with relation to the degree of deviation of the frequency from the nominal frequency.

Under the first broad aspect, the invention yet provides a water heater, having a resistive load for connection to an AC power grid for heat generation and a power control device for regulating electrical power consumed by the resistive load. The power control device is configured for detecting deviations of the grid frequency from a nominal grid frequency and reducing the power the resistive load consumes in a continuous fashion with relation to the degree of deviation of the grid frequency from the nominal frequency.

Under the first broad aspect, the invention also provides a water heater, having a resistive load for connection to an AC power grid for heat generation and a power control device for regulating electrical power consumed by the resistive load. The power control device is configured for detecting an occurrence of a frequency instability event on the basis of frequency information derived via a power connection to the AC power grid and reducing the power the resistive load consumes in a continuous fashion with relation to the degree of frequency instability.

Under the first broad aspect, the invention yet provides a method for increasing the frequency stability of an AC power grid that supplies multiple and geographically dispersed dwellings with electrical power. The method including providing several ones of the dwellings with an electrical load that is connected to the AC power grid, deriving grid frequency information via a power supply connection between the electrical load and the AC power grid and determining on the basis of the grid frequency information if the grid frequency deviates from a nominal grid frequency and reducing the power the electrical load consumes in a continuous fashion with relation to the degree of deviation of the grid frequency from the nominal grid frequency.

Under the first broad aspect, the invention further provides a method for increasing the frequency stability of an AC power grid that supplies multiple and geographically dispersed dwellings with electrical power. The method includes providing several ones of the dwellings with an electrical load that is connected to the AC power grid, processing grid frequency information sensed via a power connection between the AC power grid and the load to detect a frequency instability event and reducing the power the electrical load consumes in a continuous fashion with relation to the degree of frequency instability.

According to a second broad aspect, the invention provides a power control device for regulating the power that a load consumes, on the basis of the AC power grid frequency. The system includes decision logic that responds to a rate of frequency deviation to implement a load shedding process during which the electrical power the load consumes is reduced partially or completely negated (load disconnected from the AC power grid).

Under the second broad aspect, the invention thus provides a power control device for use in an AC power grid for regulating an electrical power a load that is supplied by the AC power grid consumes. The power control device has a frequency sensing functional block for detecting a rate of deviation of the grid frequency and a logic functional block for performing a load shedding process during which the power the load consumes is reduced. The load shedding process is characterized by parameters, the logic functional block controlling one or more parameters of the load shedding process at least in part on the basis of the rate of deviation of the grid frequency.

Under the second broad aspect, the invention also provides a method for regulating an amount of power a load connected to an AC power grid is allowed to consume. The method includes detecting a rate of deviation of the frequency of the AC power grid via a power supply connection between the load and the AC power grid, controlling a parameter of a load shedding process during which the power the load consumes is reduced, at least in part on a basis of the rate of deviation of the frequency and implementing the load shedding process with the controlled parameter.

Under the second broad aspect, the invention further provides a water heater, comprising a resistive load for connection to an AC power grid for heat generation and a power control device for regulating electrical power consumed by the resistive load. The power control device is configured for: detecting a rate of deviation of a frequency of the AC power grid via a power supply connection between the load and the AC power grid and reducing the power the load consumes to a level determined at least in part on a basis of the rate of deviation of the frequency.

Under the second broad aspect, the invention further provides a method for increasing the frequency stability in an AC power grid that supplies multiple and geographically dispersed dwellings with electrical power. The method including providing several ones of the dwellings with an electrical load for connection to the AC power grid, processing at the respective dwellings grid frequency information sensed via a power connection between the AC power grid and the load at the dwelling to derive a rate of frequency deviation and reducing the power to the electrical load at a rate that is faster than the rate of frequency deviation would have been if the power to the electrical loads in the several ones of dwellings would not have been reduced.

Under the second broad aspect, the invention also provides a method for increasing the frequency stability of an AC power grid that supplies multiple and geographically dispersed dwellings, wherein the AC power grid manifests a rate of frequency deviation as a result of a power generation deficit. The method including providing several ones of the dwellings with an electrical load for connection to the AC power grid and subsequent the occurrence of the imbalance, reducing the power to the individual electrical loads at a rate that is equal or exceeds the rate of frequency deviation.

Under the second broad aspect, the invention yet provides a method for increasing the frequency stability of an AC power grid that supplies multiple and geographically dispersed dwellings, wherein the AC power grid stores an amount of kinetic energy that is reduced when the AC power grid experiences a power generation deficit. The method including providing several ones of the dwellings with an electrical load for connection to the AC power grid, processing at the respective dwellings grid frequency information sensed via a power connection between the AC power grid and the load at the dwelling, deriving from the grid frequency information data indicative of a rate of kinetic energy dissipation of the AC power grid and reducing the power the electrical load consumes at a level determined at least in part on a basis of the data indicative of the rate of kinetic energy dissipation.

Under the second broad aspect, the invention also provides a power control device for use in an AC power grid for regulating an electrical power a load that is supplied by the AC power grid consumes. The power control device comprising a frequency sensing functional block deriving frequency information via a power supply connection between the AC power grid and the load and a logic functional block. The logic functional block deriving from the grid frequency information data indicative of a rate of kinetic energy dissipation of the AC power grid and performing a load shedding process during which the power the load consumes is reduced, the load shedding process being characterized by parameters, the logic functional block controlling one or more parameters of the load shedding process at least in part on the basis of the rate of kinetic energy dissipation.

According to a third broad aspect, the invention provides a method for testing an AC power grid to determine the load reduction reserve of the AC power grid.

More specifically, the invention provides under the third broad aspect a process for determining a degree of load reduction an AC power grid manifests in response to a frequency instability event, where the power grid supplies a multiplicity of loads which are geographically distributed and remote from one another and each load is controlled by a power control device. The power control device reducing the amount of electrical power the load is allowed to consume in response to a frequency instability event and being responsive to frequency encoded messages impressed on the power grid to reduce the electrical power the load is allowed to consume. The method including impressing on the power grid the frequency encoded message to command the power control devices associated with the respective loads to reduce the electrical power the loads are allowed to consume, the impressing being performed in the absence of a frequency instability event and observing a collective response of the multiplicity of loads to the frequency encoded message.

Under the third broad aspect, the invention also provides a process for estimating the behavior of an AC power grid when the frequency of the AC power grid deviates from a nominal frequency, wherein the AC power grid supplies a plurality of loads which are geographically distributed and remote from one another and each load is controlled by a power control device configured for reducing the electrical power consumption of the load when the frequency of the power grid deviates from the nominal frequency. The method including directing the power control devices to reduce the electrical power consumption of the respective loads when the grid frequency is at or near the nominal frequency and observing a behavior of the AC power grid to a combined effect of the power consumption reduction of the individual loads.

Under the third broad aspect, the invention further provides a process for testing an AC power grid that supplies a plurality of loads controlled by respective power control devices, each power control device being responsive to an under-frequency condition in the AC power grid for reducing power consumption of the associated load. The process include the steps of directing individual ones of the power control devices to reduce the power consumption of the respective loads when no under-frequency condition exists in the AC power grid and determining on the basis of the directing the degree of load reduction capacity the AC power grid would manifest in the event of an under-frequency condition.

According to a fourth broad aspect, the invention provides a strategy to modulate the energy injected in an AC power grid from a supplemental energy source on the basis of the frequency of the power grid, When the AC power grid experiences a power generation deficit, which manifests itself by a decrease of the frequency of the AC power grid, the energy injected in the power grid from the supplemental energy source is increased to stabilize the power grid frequency.

Examples of supplemental energy sources include solar panel arrays, wind turbines and energy storage devices such as flywheels and electrical batteries.

Under the fourth broad aspect, the invention thus provides a power control device for use in an AC power grid for regulating an electrical power that is transferred to the AC power grid from a supplemental energy source. The power control device has a frequency sensing functional block for detecting deviations of the grid frequency from a nominal grid frequency and a logic functional block for implementing a power regulation process. During the power regulation process, the power transferred to the AC power grid is increased when the frequency sensing functional block determines that the grid frequency has decreased from the nominal grid frequency.

Preferably, the power transfer increase is in relation to the degree of decrease of the grid frequency. The increase is made in a continuous fashion.

Under the fourth broad aspect, the invention further provides a method for increasing the frequency stability of an AC power grid that supplies multiple and geographically dispersed dwellings with electrical power. The method comprising the steps of providing a supplemental energy source that is connected to the AC power grid, deriving grid frequency information and determining on the basis of the grid frequency information if the AC power grid frequency deviates from a nominal grid frequency. The method also includes transferring electric energy from the supplemental energy source into the AC power grid at a rate determined at least in part on a degree of deviation of the grid frequency from the nominal grid frequency.

Under the fourth broad aspect, the invention yet provides a power control device for use in an AC power grid for regulating a transfer of electrical energy from a supplemental energy source into the AC power grid. The power control device comprising a frequency sensing functional block for detecting a degree of deviation of the grid frequency from a nominal frequency and a logic functional block for performing an energy input augmentation process during which the rate at which energy is transferred from the supplemental energy source into the AC power grid is increased, the energy input augmentation process being characterized by parameters, the logic functional block controlling one or more parameters of the energy input augmentation process at least in part on the basis of the degree of deviation of the grid frequency;

Under the fourth broad aspect, the invention also provides a method for regulating a rate of energy transfer from a supplemental energy source to an AC power grid. The method comprising the steps of detecting a rate of variation of a frequency of the AC power grid via a power supply connection between the supplemental energy source and the AC power grid, controlling a parameter of an energy input augmentation process during which the rate at which energy is transferred from the supplemental energy source into the AC power grid is increased, at least in part on a basis of the rate of variation of the frequency and implementing the energy input augmentation process with the controlled parameter.

Under the fourth broad aspect, the invention yet provides a method for increasing the frequency stability of an AC power grid, wherein the AC power grid manifests a rate of frequency deviation as a result of an imbalance due to a power generation deficit, the method including providing a supplemental energy source that is connected to the AC power grid and subsequent the occurrence of the imbalance, increasing a rate of energy transfer from the supplemental energy source into the AC power grid at a rate that is equal or exceeds the rate of frequency deviation.

BRIEF DESCRIPTION OF THE DRAWINGS

A detailed description of non-limiting examples of implementation of the present invention is provided hereinbelow with reference to the following drawings, in which.

Figure 1:
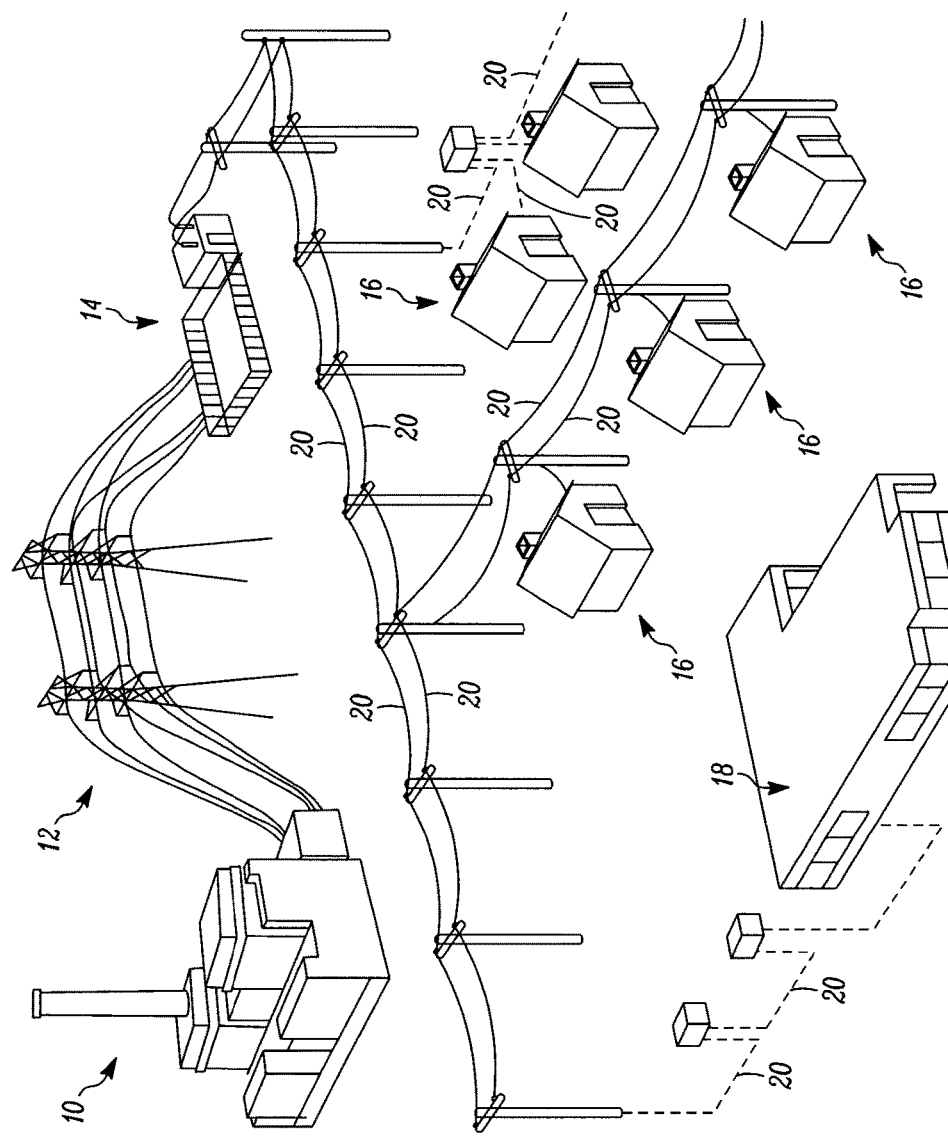
FIG. 1 shows an example of an electrical power grid, illustrating the power generation side and the distributed load side of the power grid.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION OF THE EMBODIMENTS OF THE INVENTION

To facilitate the description, any reference numeral designating an element in one figure will designate the same element if used in any other figure. In describing the embodiments, specific terminology is used but the invention is not intended to be limited to the specific terms so selected.

FIG. 1 shows an AC power grid. Electricity is generated at a power plant 10 and is transmitted over high voltage transmission lines 12 to a voltage down step station 14. The voltage down step station 14 lowers the electrical voltage (via transformers for example) such that it may be distributed to households 16 and industrial buildings 18 via residential distribution lines 20.

In a first example of implementation, the present invention provides a power controller 32 that can regulate the electrical load that household appliances or industrial equipment are allowed to consume. By using a sufficient number of such power control devices, a significant portion of the grid load is controllable and can thus provide a significant effect on the overall power demand. Accordingly, the power control can be invoked to lower the electrical load in periods of peak demand and/or when a power generation unit fails, thus reducing the production capacity.

Figure 2:
FIG. 2 is a bloc diagram of a power control device in accordance with a non-limiting example of implementation of the invention used to regulate the electrical power that a load is allowed to consume, based on the AC frequency.

FIG. 2 is a diagram of the power controller 32, showing the power controller 32 connected to an AC supply 30 (which is the AC power grid) and to an electrical load 34. The power controller 32 monitors the frequency of the AC supply 30 via the power supply connection to the AC supply. If the frequency varies from its nominal value, the power controller 32 reacts to shed the load accordingly or in exceptional cases to increase it. Note that for the purpose of this specification the expressions "load shedding" and "power reduction" and "load reduction" are used interchangeably.

Figure 3:
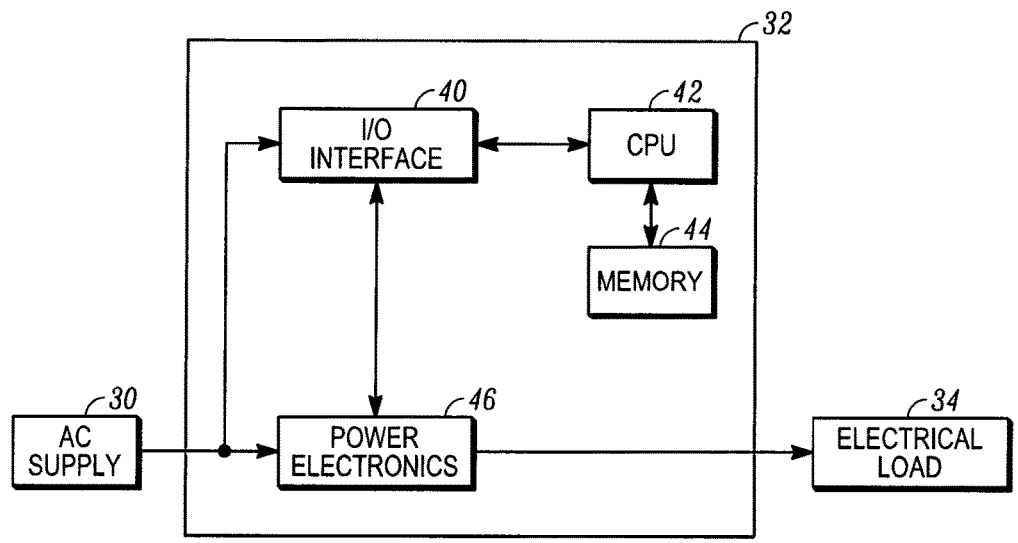
FIG. 3 is a more detailed bloc diagram of the power control device shown in FIG. 2.

With reference to FIG. 3, a more detailed bloc diagram showing the different components of the power control device of FIG. 2 are shown. The power controller 32 is computer based and uses software to interpret the AC frequency and implement the desired load shedding strategy. The power controller 32 has an input/output interface 40, a CPU 42, a machine-readable storage 44 and power electronics 46. Signals representative of the AC frequency, which are sensed via the power supply connection between the electrical load 34 and the AC supply 30 are communicated to the power controller 32 via the input/output interface 40. The input/output interface 40 reads the frequency information, digitizes it and makes it available to the CPU 42 for processing.

The machine-readable storage (memory) 44 is encoded with software executed by the CPU 42. The software implements the load shedding strategy. The I/O interface 40 outputs control signals that are generated by the software to command power electronics 46 for performing the actual power control. The power electronics 46 typically would include thyristors or power transistors that can lower the RMS voltage supplied to the electrical load 34. The power electronics 46 can simply chop segments of the voltage wave to effectively lower the RMS supply voltage hence, the amount of power the load consumes.

The control signals output from the I/O interface 40 convey information indicating the amount of power reduction desired. In response to these control signals the power electronics 46 control the AC voltage wave accordingly.

Examples of Loads that can be Controlled

The loads that are the most suitable to be controlled by the power controller 32 are resistive loads. The power consumed by a resistive load can be adjusted by varying the supply voltage to provide a continuous range of power consumption regulation.

Another example of a load that also can be controlled by the power controller 32 is a load that consumes power at several discrete levels. In such case, the power control device varies the power consumption of the load by selecting the maximal level of power consumption of the load. Note that in the latter case, the power control device may not need to adjust the AC voltage that is applied to the load. Rather, it sends control signals to the load to direct the load to cap its power consumption at a particular level.

In one specific example of implementation, the electrical load 34 is a water heater in a dwelling. If a decrease in the power consumption of the water heater is necessary, the power electronics 46 will reduce the supply voltage according to the programmed control strategy to obtain the desired power consumption reduction. The decrease in power level can be enforced for a short period of time (for example, ten to thirty minutes) to avoid an excessive cooling of the water load. In this particular example, it is unlikely that the power consumption reduction will affect in a major fashion the functionality of the apparatus and would be almost imperceptible to the end user. The large thermal mass of the water load (assuming that it is at the set point temperature when the load reduction was initiated) may reduce the water temperature by a few degrees and be virtually unnoticeable by the end user. As will be further discussed below, such an effect would be even less perceptible if the power control occurs at times during which the water heater is not being heavily used, such as during the night.

Another example of a load suitable to be controlled is a heating system in a commercial building or a home. In such embodiments, if it is necessary to decrease the power consumption of the load, the power controller 32 can instruct the heating system to reduce the consumed power for a period of thirty minutes for example. During such a control period, it can be understood that the overall temperature of the commercial building or home may not vary greatly. Hence, such a variation to the end user would once again be small. Note that the heating system may be of resistive nature (electrical heating elements) that can be regulated via the power electronics 46.

Yet another example of a load suitable to be controlled would be an industrial facility implementing a process that requires a significant amount of electrical energy but whose power consumption can be reduced to some degree over a certain period of time without any major drawback on the process itself. An example is an aluminum smelter.

Another example of an apparatus to which a power controller can be connected is an oven for food preparation purposes. For example, if the oven is set to operate at a temperature of 450° F., a reduction in power supplied to the oven for a short period of time will not drastically change the temperature of the oven. The oven control can be similar to the heating system control described earlier.

Yet another example of the load that could be controlled by the power controller 32 is a clothes dryer. The clothes dryer includes a heating system that can be regulated in a continuous fashion as described earlier. In a period of usage, the power controller 32 can reduce the amount of electrical power made available to the heating system of the dryer. From the point of view of the end-user, this electrical power reduction will translate into a longer drying time.

Power Regulation Strategy

Generally, the power regulation strategy has two main phases. The initial phase is a response to an observed frequency decrease. The purpose of this response is to adjust the power consumed by the electrical load 34. In this specification, it is referred to as "load shedding" or "power reduction". The second phase of the power regulation strategy is the power restoration phase. During this phase, the electrical power that the load 34 consumes is restored. An important consideration during the power restoration phase is to perform this restoration without triggering a further frequency instability by overloading the grid, which is likely to occur if the power restoration is performed at once. For that reason, the power restoration could be performed at a rate, which is slower than the rate at which power was initially reduced.

Figure 4:
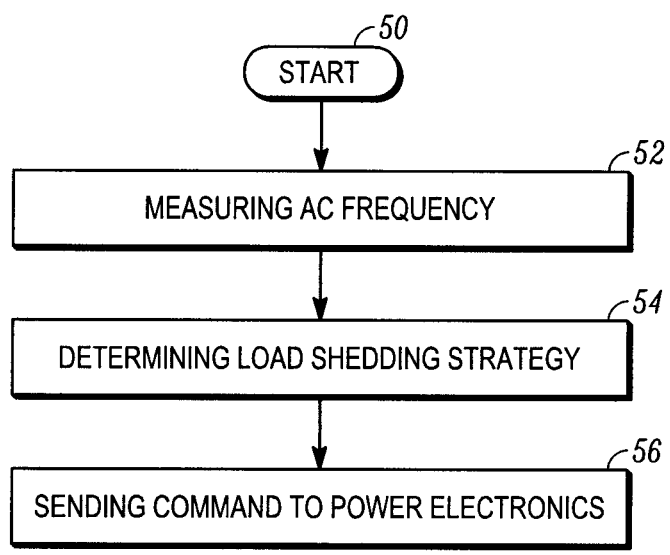
FIG. 4 is a flow chart of the process implemented by the power control device of FIG. 3 for controlling an electrical load.

FIG. 4 is a flow chart of an example of the process implemented by the power controller 32 for controlling an electrical load. After the power controller 32 is in an active state (generally represented by a "Start" condition at step 50), the logic of the power controller 32 proceeds to step 52 where the AC frequency is measured to determine if a power regulation strategy needs to be implemented.

The purpose of the AC frequency assessment is to detect an imbalance between the generation side of the grid and the load side thereof, which is reflected by the frequency deviation. Typically, the larger the deviation the larger the imbalance is. The output of step 52 is thus a frequency value. Since the power controller 32 performs digital data processing, the frequency value is preferably generated in a digital format. Any suitable methodology can be used to convert the AC analog waveform into digital frequency information. A possible refinement is to perform several frequency measurements and to compound those measurements into a single representative value, such as by averaging them. Specifically, the power controller 32 is programmed to acquire over a predetermined period of time a frequency measurement, which is stored in the memory of the power controller 32. In a specific example, a frequency measurement can be made at every 100 ms interval, but this value can vary without departing from the spirit of the invention. Generally, the measurement interval depends on the processing speed of the CPU 42; the faster the CPU 42 and the system overall, the larger the number of frequency measurements in a given time period.

The frequency measurement is done by computing the period of one or more consecutive cycles of the AC voltage and deriving from the period information the fundamental frequency. When the frequency is measured at each 100 ms, and assuming a 100 ms measurement window, the system measures the period of at least one AC voltage cycle within that 100 ms window.

The memory of the power controller 32 keeps a certain number of frequency measurements. As a new measurement becomes available, it is stored in the memory and the oldest measurement is overwritten. All the frequency values that are stored in the memory are averaged as a new frequency measurement becomes available. The average measurement smoothes out short-term frequency variations that may not be indicative of the grid frequency instability.

Note that instead of averaging the frequency measurements, other ways to blend this data into a single representative value exist without departing from the spirit of the invention.

In addition to computing a compound frequency measurement, which reflects the current frequency value, step 52 also computes the rate of variation of the frequency. The rate of variation of the frequency is an indicator of the AC power grid stability; the faster the frequency diminishes the greater the risk of AC power grid collapse. Accordingly, the rate of variation of the frequency can be used as a factor to tailor the load shedding response in order to restore the balance between the generation side and the load side of the AC power grid, or at least prevent further balance deterioration.

Several possibilities exist to determine the rate of frequency variation. One is to measure the rate of frequency variation from the nominal AC power grid frequency versus time. In other words, the process computes the first order derivative of the frequency change versus time. Practically, this measure reflects the speed at which the frequency varies.

Another possibility to determine the rate of frequency variation is to measure the rate at which the speed of variation of the frequency itself varies. This measurement, which is the derivative of the rate of frequency variation versus time, reflects the acceleration of the frequency variation.

The rate of frequency variation versus time is computed on the basis of consecutive frequency measurements stored in the memory and the time intervals separating the frequency measurements. If desired, further computations can then be performed to derive the acceleration of the frequency variation from the speed of frequency variation.

The load shedding strategy is determined on the basis of several factors, namely the current value of the frequency, the rate at which the frequency varies or both. Other factors can also be used to further fine-tune the load shedding strategy.

The power controller 32 implements decision logic based on the compounded frequency measurement and also the rate of frequency variation in order to determine the load shedding strategy to be employed. Subsequently, the power controller 32 sends a corresponding command to the power electronics 46 (via control signals, for example) as represented by step 56 to be described later.

Step 54 of the process thus uses the compounded frequency measurement and the rate of variation of the frequency as an input in determining if load shedding is required and optionally the strategy to be employed (when different strategies can be used). In instances, when the AC power grid is stable and the frequency is within a nominal acceptable range, the processing at step 54 determines that no load shedding is necessary and no further action takes place. This processing loop repeats constantly to provide a continuous monitoring of the grid frequency stability. However, when a frequency instability event is detected, step 54 invokes a load shedding response.

When a large number of power controllers 32 are installed in the electrical network or grid, each of them responds independently to the frequency instability event. However, since the responses are coherent and predictable they all add up to a combined load shedding that has a grid-wide effect.

Figure 5:
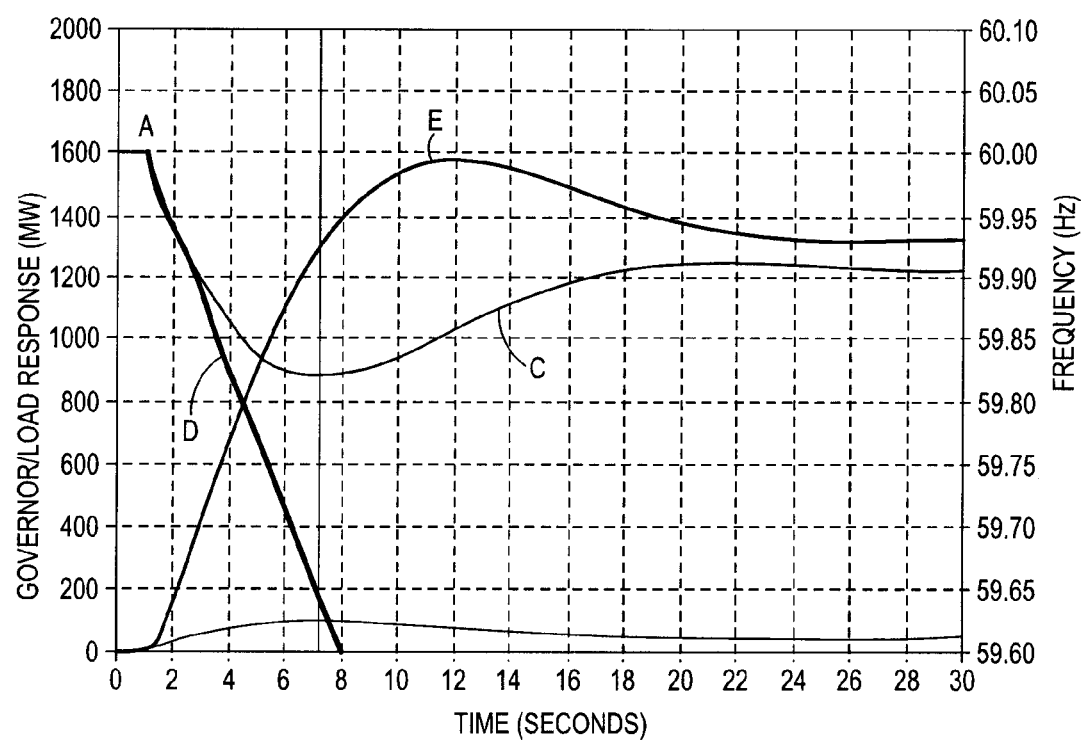
FIG. 5 is a graph, which illustrates the variation of the frequency in an AC power grid as a result of a loss of a generation unit.

FIG. 5 is a graph, which illustrates how the frequency typically varies in an AC power grid, when a generation unit is lost. As a result of the loss of the generation unit, the balance between the generation side and the load side is upset, which will cause the grid frequency to progressively diminish. In the graph of FIG. 5, point A represents the loss of a generation unit, which roughly is of about 1600 MW. At that moment, since the AC power grid manifests a power generation deficit, the frequency that is illustrated by curve C starts to diminish. The rate at which the frequency varies versus time from the nominal frequency during this initial phase, which is illustrated by the slope D, is function of the inherent AC power grid inertia. The inertia of the AC power grid depends on a number of factors, such as the size of the AC power grid, the relative size of the generation units and other factors. Suffice it to say that in AC power grids that have relatively low inertia the rate of frequency drop will be higher than in those that have higher inertia.

The equation $\Delta f/\Delta t = \Delta Pe(2H+D)$ represents the mathematical relationship between the frequency rate of variation versus time, the magnitude of the power generation lost and the AC power grid inertia. $\Delta f/\Delta t$ represents the rate of variation of the frequency versus time. $\Delta Pe$ represents the amount of electrical power that is no longer available to the AC power grid, while (2H+D) is essentially a constant. More particularly, D is a load-damping factor that typically ranges from 0 to 2, where 2 represents the scenario where all electric motors that the AC power grid supplies are connected to the AC power grid at the moment the imbalance occurs. H is an inertia constant that is a characteristic of the AC power grid itself and it is a function of the interconnection and all synchronous power generation sources. H typically ranges from 2.5 to 6.5.

As the equation suggests, the frequency will vary much faster in an AC power grid that has lower inertia than in one that has a higher inertia, for the same power generation deficit.

When a power generation unit is lost, the AC power grid reacts to compensate this loss by increasing the power generation from remaining power generation units. That response, however, which is illustrated by the curve E in the graph of FIG. 5 is relatively slow because it involves mechanical actions, such as opening valves to increase the water flow to turbines. Accordingly, it takes some time before the commanded action produces a power injection effect. In the example of FIG. 5, assuming the power increase directive has been issued immediately upon the loss of the power generation unit, it takes almost up to 2 seconds for an effect to manifest itself and up to 12 seconds for the power deficit to be compensated.

During this 2-second period, the AC power grid is largely uncontrolled and only the grid inertia buffers the frequency drop. In severe cases, where the inertia of the AC power grid is comparatively low and a large power generation unit is lost, the frequency may drop too much before any compensation takes effect, thus triggering a partial of full AC power grid collapse.

Figure 6:
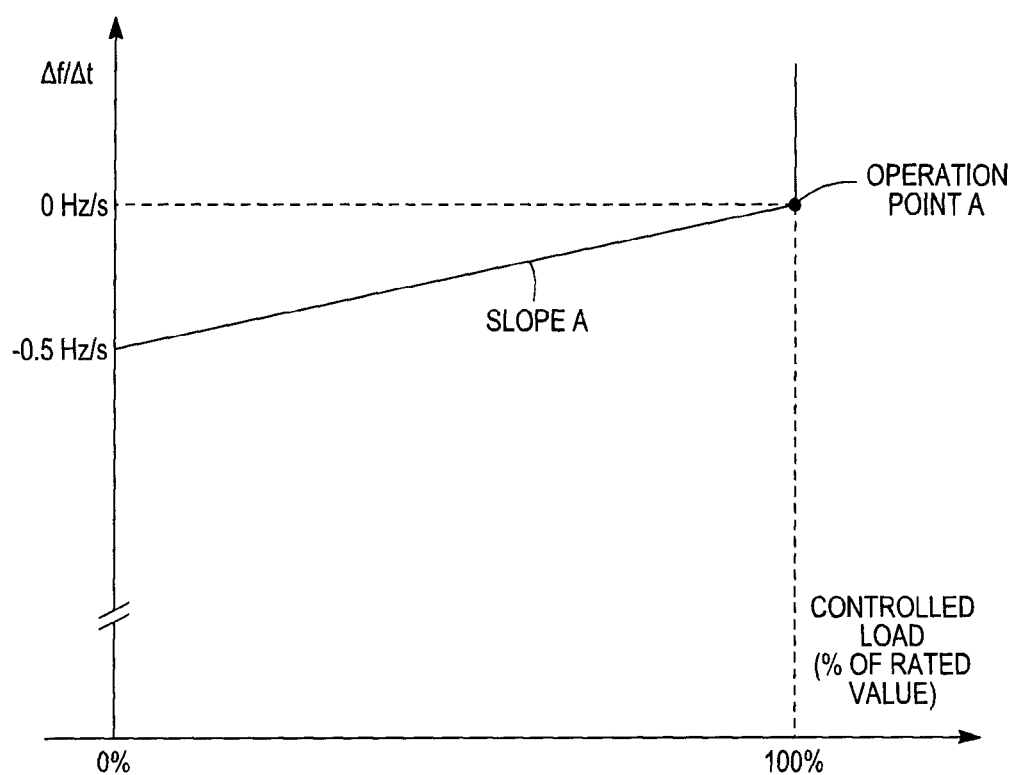
FIG. 6 is a graph, which illustrates an example of a linear load shedding strategy.

FIG. 6 is a graph depicting an example of load shedding in relation to the AC frequency, which provide a fast system response to further buffer the frequency drop during the initial time period, before any power generation injection has been performed. The response is represented by a line of constant slope (slope A), which establishes a linear relationship between the rate of variation of the AC power grid frequency versus modulation % of the electrical load 34. Operation point A occurs at a rated frequency of 0 Hz/sec when the load is fully supplied (100% supplied). However, when the frequency rate of variation versus time is decreasing below the rated value to a point at which a frequency instability event is considered to be occurring the electrical power available to the electrical load 34 is reduced proportionally to the frequency rate of variation versus time. The rate at which the load 34 is reduced in relation to the frequency rate of variation versus time is determined on the basis of the measured rate of frequency variation versus time; the higher this rate the higher the rate at which the electrical load 34 is reduced.

In the representation at FIG. 6, a zero slope, shown in dotted lines would produce an instant de-powering of the load, so the lower the slope the more aggressive the response is. In that example, a slope of −0.5 Hz/sec will trigger a load de-powering when the rate of frequency decrease is of −0.5 Hz/sec or higher. Generally, the range of load shedding could be operative in the range from about 0 Hz/sec to about −0.6 Hz/sec. In other words, load shedding will begin at any deviation from 0 Hz/sec and reach a full load de-powering at about −0.6 Hz/sec. Preferably this range could be from about −0.05 Hz/sec to about −0.1 Hz/sec.

From an implementation perspective, the memory 44 of the power controller 32 stores a series of tables mapping current frequency to respective power consumption values according to a linear relationship, where each table is associated with a respective rate of frequency variation versus time. Once the rate of frequency variation versus time has been computed, the table associated with that frequency rate of variation versus time is selected from the memory 44 and the power consumption of the electrical load 34 modulated based on the data in that table.

Instead of using a table look-up operation, an algorithm can be programmed to compute directly the power consumption of the electrical load 34, based on the rate of frequency variation versus time.

Figure 7:
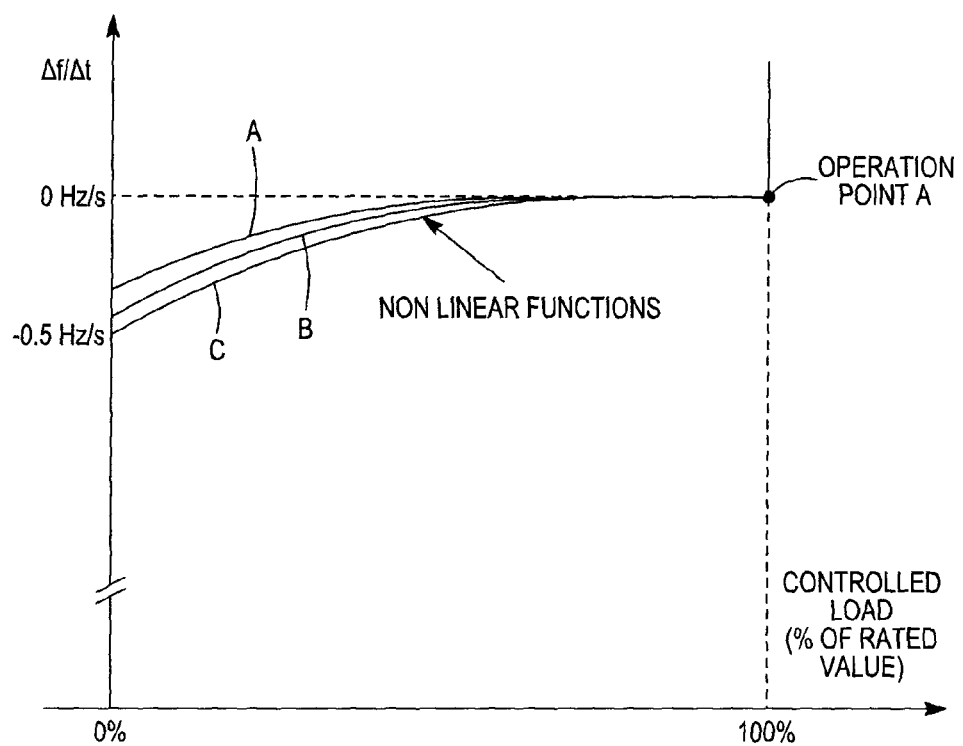
FIG. 7 is a graph, which illustrates an example of a non-linear load shedding strategy.

The load shedding strategy example illustrated in FIG. 6 is based on a linear relationship between the rate of frequency variation versus time and controlled load (% of load rated value). Alternatively, the variation in controlled load in relation to the rate of variation in frequency versus time can also occur in a non-linear manner as shown in FIG. 7. The non-linear function has the advantage of providing a more aggressive load reduction effect with increasing frequency deviation.

In this instance, the rate of variation of the frequency versus time determines the degree of aggressiveness of the load reduction. FIG. 7 shows three different response curves A, B and C, which are associated with different rates of frequency variation versus time. Response curves A, B and C respectively, provides a decreasing response aggressiveness. In other words, response curve A provides a more aggressive response and will reduce the load faster for a given frequency than anyone of response curves B and C. As in the case of the previous implementation example, look-up tables can be used or an algorithm can be programmed to identify from a particular response curve the allowed power consumption given the frequency rate of variation versus time.

The load shedding strategy can be modified to implement a dead band where no load shedding takes place as long as the rate of frequency variation versus time is within the dead band boundaries. The dead band spread can be set on the basis of a frequency rate of variation versus time window within which rates of frequency variations versus time occur but are considered normal. In other words, as long as the frequency rate of variation versus time remains within that frequency variation rate of variation versus time window the frequency of the power grid is considered to be stable and no frequency instability is occurring. In this example, frequency instability occurs when the frequency rate of variation versus time exceeds the window boundaries. For example, in a typical AC power grid the nominal frequency rate of variation versus time is of 0 Hz/sec, and the frequency variation window, which is centered on the 0 Hz/sec value could have a spread of ±0.05 Hz. This means that as long as the frequency rate of variation versus time remains within that window, it is considered stable and it will not invoke any load shedding response. However, a variation outside the range of ±0.05 Hz/sec from the operation point at 0 Hz/sec will cause the power controller 32 to decrease the power consumed by the load.

Yet another possible example of a load shedding strategy is to use a binary response where the power to the electrical load 34 is completely turned off, when the rate of frequency variation versus time exceeds a certain degree which is indicative of impending AC power grid collapse. This binary response strategy can be used either on its own or in combination with other load shedding strategies described earlier. When used alone, the power controller 32 does not modulate the electrical load 34 and solely provides protection against severe frequency instability events. The load shedding strategy is thus triggered when the rate of frequency variation versus time exceeds a threshold that is indicative of a serious imbalance between the generation side and the load side of the AC power network. When used in combination with other load shedding strategies that also modulate the power consumption of the electrical load 34, this binary control mechanism is invoked as a last resort when the threshold of frequency rate of variation versus time is exceeded.

Instead of using the rate of frequency variation versus time as a basis for determining the load shedding response, the acceleration of the frequency variation could be used, which provides yet another order of prediction of the frequency stability. A load shedding response based on the acceleration of the frequency variation can be implemented in a similar way to the load shedding response based on the rate of frequency variation versus time. More specifically, the acceleration of the frequency variation versus time is computed by taking a second order derivative of the frequency versus time and look-up tables or an algorithm used to derive the degree of load shedding.

The examples of load shedding strategies described above provide an adaptive response to the severity of frequency instability events and can thus protect the AC power grid from collapsing event when large power generation deficits occur or when the AC power grid inertia is low. Since the load shedding strategy uses as a factor the rate of frequency variation, hence it is forward looking and not just responsive to the instant conditions, it can adapt the response such that the rate at which the load is being shed is higher than the rate of frequency variation as it exists immediately following the occurrence of the imbalance, and that will continue without reduction if no such load shedding would occur.

From another perspective, the rate of frequency variation, whether the speed of variation or the acceleration of the variation constitutes an indicator of the rate at which the kinetic energy of the AC power grid is being depleted. The AC power grid stores kinetic energy, as described earlier, which constitutes an energy buffer that can compensate temporarily a power generation imbalance. The higher the kinetic energy content of the AC power grid, the slower the frequency will decay when an imbalance arises. Thus the frequency at the power supply connection of the load to the AC power grid and especially how the frequency varies is an indicator of the rate of kinetic energy dissipation of the AC power grid. In turn that information can be used to choose the appropriate load shedding response.

When the frequency instability subsides, which occurs when additional power generation capacity has been put on line to compensate the initial loss of power generation, the load shedding operation is terminated and the power to the electrical load 34 is restored either fully or partially.

Another example of a load shedding strategy uses the current value of the frequency rather than the rate of frequency variation. This is a simpler approach where the frequency value determines the degree of load shedding. The relationship between the frequency value and the degree of load shedding may be linear or non linear to provide a more aggressive response with an increasing deviation of the frequency with relation to the nominal frequency.

Figure 13:
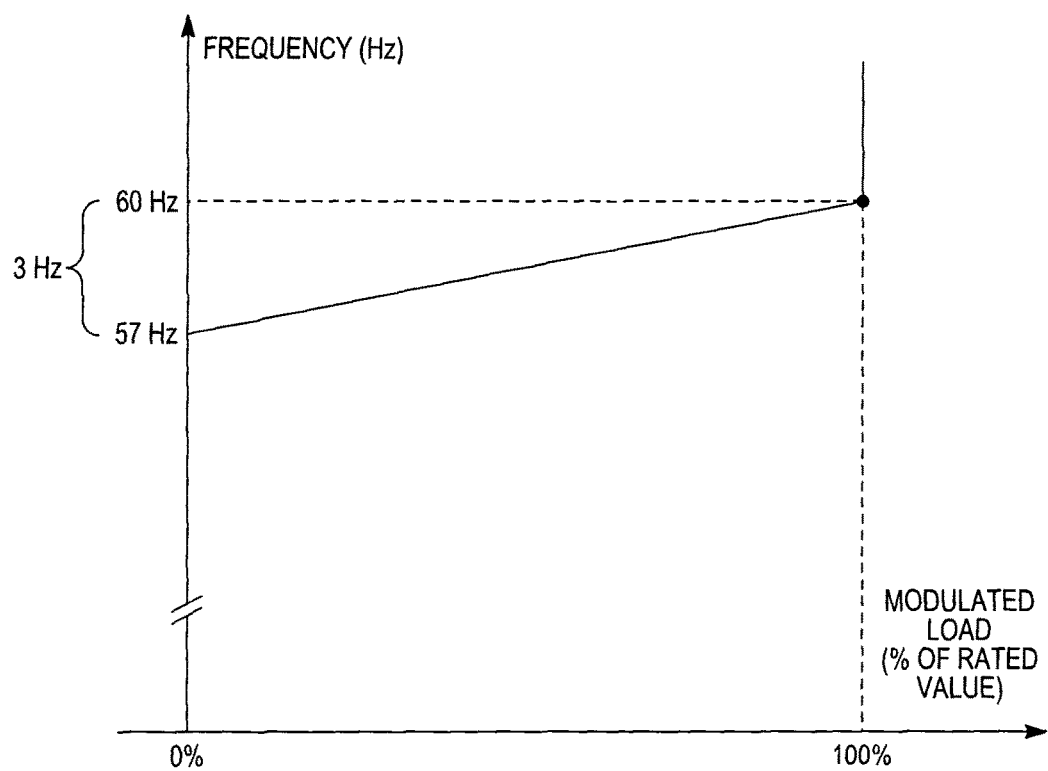
FIG. 13 is an example of another load shedding strategy that is based on a linear relationship between the instantaneous frequency value and the degree of load shedding.

FIG. 13 illustrates an example of a linear response based on frequency value. In this example, the slope of the response curve is such that full load de-powering occurs when the frequency deviates from the nominal frequency by a value of 3 Hz or more.

Figure 14:
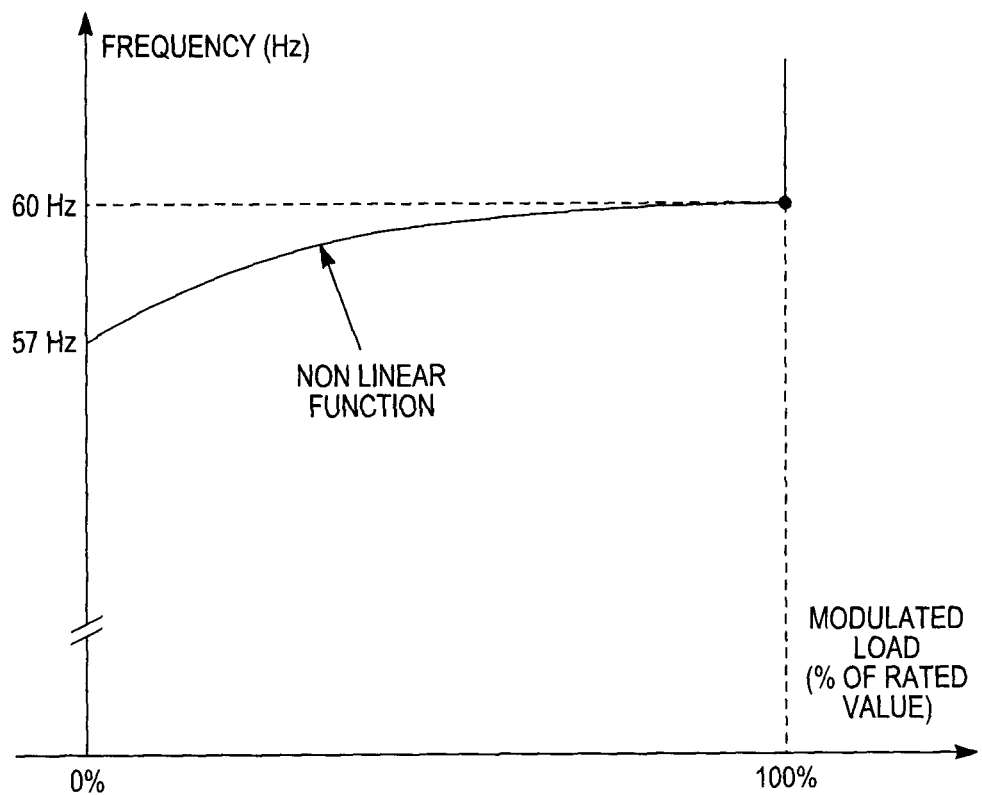
FIG. 14 is yet another example of a load shedding strategy that is based on a non-linear relationship between the instantaneous frequency value and the degree of load shedding.

FIG. 14 shows an example of a non-linear response where the initial load shedding is gentler but accelerates with an increasing frequency drop. As in the previous case, full load de-powering occurs at 3 Hz or more of frequency deviation.

In the examples shown at FIGS. 6, 7, 13 and 14, the load is varied in a continuous fashion with frequency deviation, whether rate or instantaneous value. In those examples, the variation is gradual and non-stepwise. In a possible variant, the variation is continuous but step-wise, where a multiplicity of discrete steps approximate the response curve.

As indicated above, the second phase of the power regulation strategy is the power restoration phase. The power restoration phase restores the power to the electrical load 34 at a rate, which is slower than the rate at which power was initially adjusted. For clarity, the expression "power restoration performed at a rate which is slower than the rate at which power was initially reduced" or any other equivalent expressions that may be used in the specification means that it takes less time to adjust initially the power to the electrical load 34 from the level at which it was when the frequency instability event was detected (initial power level) to another level (adjusted power level) than it takes to restore it back from the adjusted power level to the initial power level, once it is determined that the frequency instability event is subsiding or is no longer present. This definition applies from the perspective of the individual power controller 32, the power grid or both.

In a specific example of implementation where power is restored by increasing the power that the electrical load 34 is allowed to consume, the power controller 32 increases the power the load is allowed to consume in a continuous and gradual fashion.

The power restoration phase may include a minimal time delay before the power to the load starts increasing. For example, the delay may be set to anywhere from about 2 seconds to about 2 hours, more preferably from about 5 minutes to about one hour and most preferably from about 10 minutes to about 30 minutes. Accordingly, once the power restoration phase starts, a timer is started programmed with the desired delay period. Concurrently with the start of the power restoration phase, the power maintenance action is initiated, during which the power to the load is held steady at the level it was when the power restoration phase was triggered. The power maintenance action continues while the timer operates and before the delay period has expired. At the expiration of the delay period the power increase action is invoked during which the power the load is allowed to consume is progressively increased. The rate of power increase is lower than the rate at which the power was diminished during the load shedding phase.

Another possibility is to use a power restoration strategy that has a degree of randomness to it. In this case, when a large number of households supplied by the grid and using independent power controllers 32 will increase their power consumption following a grid instability event, the increase will happen gradually without creating a load spike. For instance, the power restoration phase for an individual power controller 32 can be such that the load fully recovers at once, in other words there is no progressive load increase. The restoration time is not fixed but varies between boundaries, say 5 minutes to 3 hours. When the power restoration phase is initiated, the power controller 32 initiates the power maintenance action and randomly sets the time for transitioning to the power increase action within those boundaries. In this example, the power to the load will be switched up to its nominal value at once, anywhere from 5 minutes to 3 hours. In the population of the power controllers 32 in the entire power grid that manage the individual loads, this random selection is effected and would result in an overall recovery operation that is gradual and balanced out over the entire power restoration time window. Thus, from a power grid perspective, the load will increase progressively over the power restoration time window as individual power controllers 32 switch their loads back to nominal value.

Note that in the case of an individual power controller 32, the power to the load will increase at a rate that may not be lower than the rate of decrease during the power compensation phase. However, collectively, the rate of power increase will be lower since the individual power switch back events are spread over a time period that is longer than the period over which the power was reduced.

Another alternative is to provide the power controller 32 with an auto-learning ability to adapt the power regulation strategy based on past events, such as to fine tune the system response. For example, the power controller 32 can take into account usage data in connection with the load that is being controlled in order to adjust the power regulation strategy such as to reduce inconvenience to the end user as much as possible. For instance, the power controller 32 stores information about energy usage of the load over a period of time, say weeks or months, to determine patterns of heavier usage and patterns of lighter usage. If a power control is required, the strategy is conditioned on the basis of expected usage of the load during that period. For example, if the energy usage pattern indicates that the load is not being used or only lightly used during the night, then a frequency instability event occurring during the night will trigger a more aggressive load reduction susceptible to assist grid frequency stabilization and less likely to inconvenience the end user. In contrast, if the power restoration occurs during the day where the load usage is higher, then the load reduction response is less aggressive to reduce user inconvenience. By "less aggressive" is meant that the load will be reduced to a lesser degree and/or the load will be restored faster.

In another example, the power regulation strategy can be adapted on the basis of the real-time condition of a particular load. For example, if the load is a water heater and the water is at a low temperature (the spread between the actual water temperature and the set point is large), this water heater can acquire a "privileged" status such that the power regulation strategy will be less aggressive than a situation where the water is at or near the set point temperature. Specifically, the power control will reduce the load to a lesser degree and/or will recover the load faster. The same behavior can be considered with a heating system load where it may be desirable to reduce the power control in instances where a significant demand is placed on the heating system before the grid instability event occurred.

Figure 8:
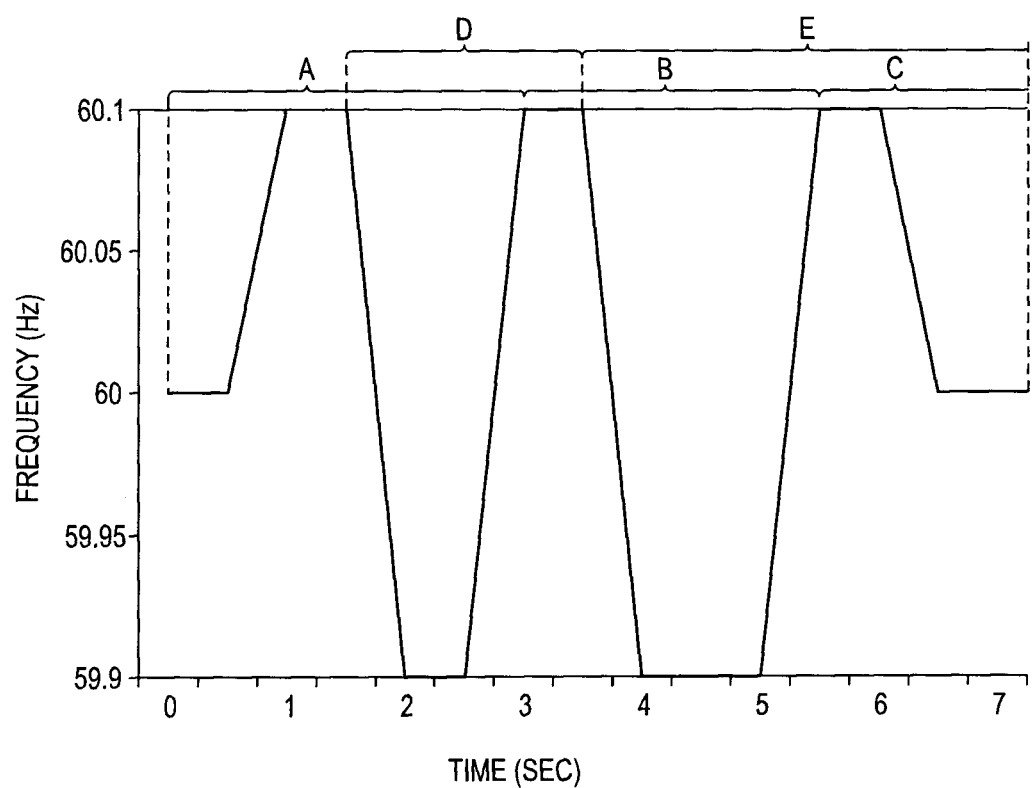
FIG. 8 is a graph that shows a frequency variation pattern to communicate messages to the power control device.

FIG. 8 illustrates a graph showing a frequency variation pattern that is impressed by the grid operator in the electrical grid and that can be used to communicate messages to the individual power control devices that continuously read the AC frequency.

The messages are frequency encoded which is accomplished by varying the frequency of the AC supply. The variations are small to avoid creating a frequency instability event. For example, the variations to perform the encoding can be kept at a percentage of the nominal or allowable frequency variation of the power grid. The percentage can be 25% for example. In a more specific example, in the case of an isolated power grid, the encoding can be done over a range of 0.2 Hz, preferably over a range of 0.15 Hz. In the case of an interconnected power grid, a range of 0.05 Hz is appropriate.

In a specific example of implementation, the memory 44 stores representations of different frequency variation patterns that the power controller 32 should be able to recognize. Since the memory 44 stores a number of frequency measurements to compute an average value, the logic of the power controller 32 compares the patterns to the set of frequency data to determine if a pattern is being transmitted. Every time a new frequency measurement is stored in the memory 44, the content of the buffer with the frequency measurements is compared to the library of patterns the power controller 32 is designed to recognize. If a pattern is recognized then an action is taken.

Furthermore, patterns of frequency variation may vary in duration. For example, some patterns may be established within a period of 3 seconds (i.e.: from a time t=0 seconds to a time t=3 seconds), while others may be established within a period of less than 2 seconds (i.e.: from a time t=5 seconds to a time t=6 seconds). In addition, longer patterns taken over periods of more than 5 seconds can also be stored in the memory 44 for comparison. It is to be understood that a given set of data may be consulted (and compared) in multiple comparative trials in order to "fit" the data to possible patterns stored in memory 44. Thus, several comparative iterations may be necessary within a given period of time in order to associate the dynamically collected data to a pattern stored in memory 44. For example, shown in FIG. 8 are different sets of data A, B, C, D and E representing different portions of the graph from time t=0 seconds to t=7 seconds. Thus, at t=3 seconds, data set A may be compared to given patterns within memory 44. If no matches are found, then data sets B or C may be compared to patterns stored in memory 44. At the same time as the comparisons of data sets A, B or C occur, different combinations of data sets may also be compared in memory 44. For example, a data set comprising sets A and B (or alternatively B and C, or alternatively A and B and C) may be compared all the while comparing data sets D and E as they are collected. In addition, it is not necessary that data sets be connected in time. For example, a given pattern stored in memory 44 may comprise a time differential between different acquired data. For example, data sets A and C can correspond to a pattern wherein a corrective action may be associated with data sets A and C regardless of the data contained between A and C (i.e.: regardless of the data set B).

The action performed when a frequency variation pattern is recognized can be a command that directs the power controller 32 to do something. Examples of such commands will de provided below.

The frequency encoded messages is structured in different ways. One example is to design the system to operate on the basis of a limited number of messages, where each message is represented by an individually recognizable frequency variation pattern. The power controller 32 is designed to recognize the frequency variation patterns and implement the actions that are associated with the patterns. The action will likely be combined action and include a command associated with some parameter, such as a time parameter.

Alternatively, the message may have a structure allowing conveying multiple elements of information. This is a more flexible approach since it allows for more communication possibilities. In a specific example of implementation, the message includes a command portion that basically tells the power controllers 32 what to do. In addition, the message also includes a time variable portion that conveys in addition to the command portion time information such as a delay or specific time at which the command is to be implemented and/or the duration for the action that the command entails. The message can be structured by frequency encoding symbols, such as individual bits. The power controller 32 is designed to decode the message by decoding the individual symbols, assembling the message and then executing the command.

A possible message structure would include a header portion that is a frequency variation pattern that can be recognized by the individual power controllers 32 as a signal that a message is being sent. The header recognition is performed as discussed in connection with FIG. 8, where the frequency data is compared to a pattern stored in memory. Once a header is detected, the power controller 32 senses individual symbols. A particular symbol can be a specific frequency variation pattern occurring over a predetermined time period. For example, the system can be designed to transmit one symbol every second. The logic of the power controller 32 assembles the symbols to determine the command that is to be executed.

To distinguish different message portions from one another, a specific frequency variation pattern can be used, which when detected indicates to the logic of the power controller 32 the end of a symbol stream and the beginning of a new one. In this fashion, the command portion of the message can be distinguished from the time variable portion.

To terminate the message, an end of message frequency variation pattern can be sent.

Figure 9:
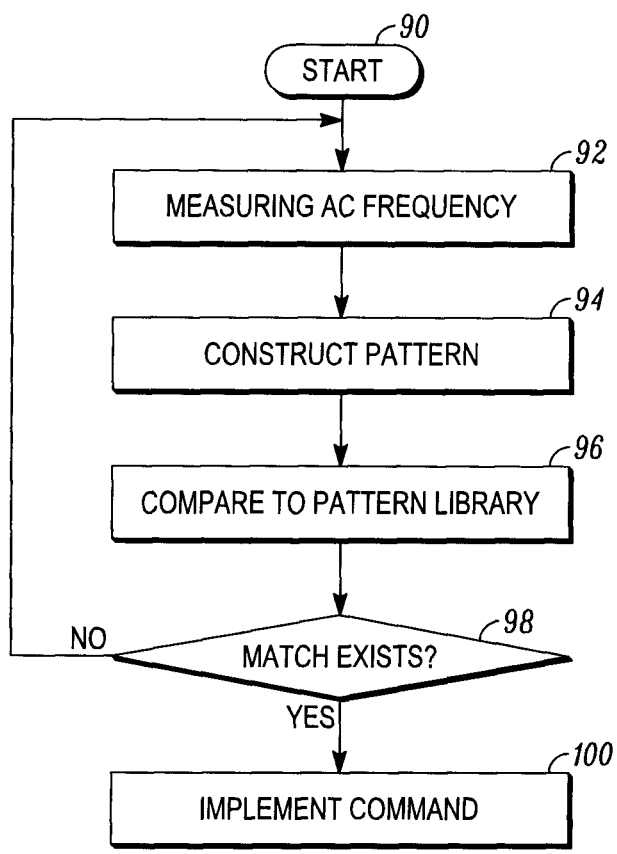
FIG. 9 is a flowchart of a process implemented by the power control device to decode messages encoded by frequency variation patterns.

FIG. 9, illustrates a flow chart outlining the steps implemented by the power controller 32 to decode and then execute frequency encoded messages. At step 92, the power controller 32 measures the AC frequency as discussed earlier. At step 94, a frequency variation pattern is constructed by mapping individual frequency values to time intervals. For example, the mapping would include associating a particular frequency value to a particular time period over which that frequency value was maintained.

The resulting frequency/time map is compared to a pattern stored in the memory of the power controller 32, at step 96. Assuming a match exists, as shown at step 98, the matching operation derives a command that is then executed. The command is implemented at step 100.

One example of a specific command that can be frequency encoded is to invoke the initial phase of the power regulation strategy, namely the load shedding phase. Such command allows the grid operator to determine the collective response of the population of power controllers 32 to a frequency instability event. That determination allows the operator to know the degree of load reduction capacity that is effectively available in the grid in the case a frequency instability event occurs.

The test involves the generation of the frequency encoded message. This is done by adjusting the frequency of the supply (when no frequency instability is present) to build the message which propagates over the entire grid and is received by each power controller 32. The message signals the power control devices to reduce the power the respective loads consume by a predetermined amount. The response of the power controllers 32 is determined by observing the state of loading of the grid. The timing and degree of load reduction is recorded and provides valuable information that can predict how the grid will react should a frequency instability event occur. The degree of loading on the grid can be determined by looking at the frequency variation that would occur as a result of the triggering of the power controllers 32. Since the effect is a load reduction, the resulting imbalance with the generation side will translate into a frequency increase. The degree of frequency increase is indicative of the degree of load reduction that is available.

As to the timing of the response, the frequency variation is mapped versus time to determine how the response, once triggered, evolves time wise. The important parameter is deriving how fast the degree of loading of the grid is lessened.

Another example of a command is to inhibit the power control function for a predetermined time period. This command is useful to prevent the power control function to occur when the grid is being restored following a power outage.

Another example of a command is to trigger the power compensation phase preemptively when an overload on the grid is expected to occur or has occurred but frequency instability is not yet observable.

Figure 10:
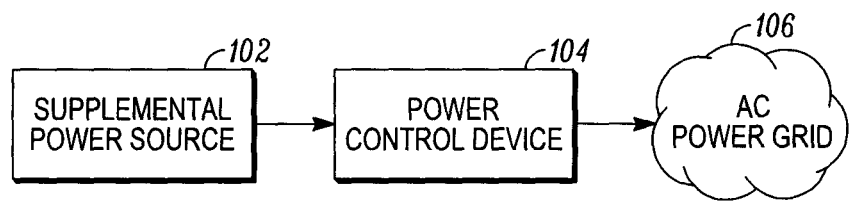
FIG. 10 is block diagram illustrating a supplemental energy source connected to the AC power grid to supply energy to the power grid.
Figure 11:
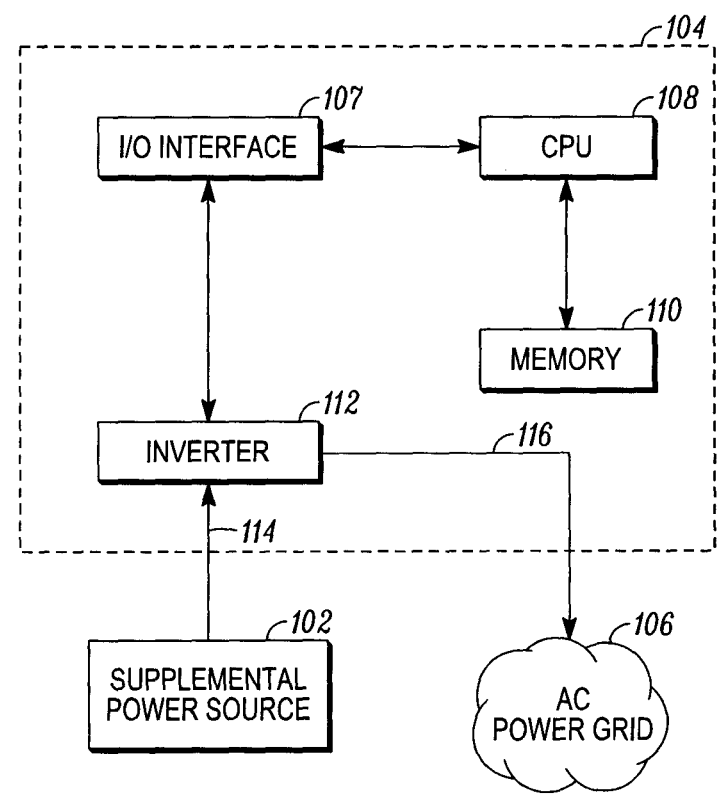
FIG. 11 is a more detailed block diagram of a power control device, which regulates the transfer of energy from the supplemental energy source to the AC power grid.
Figure 12:
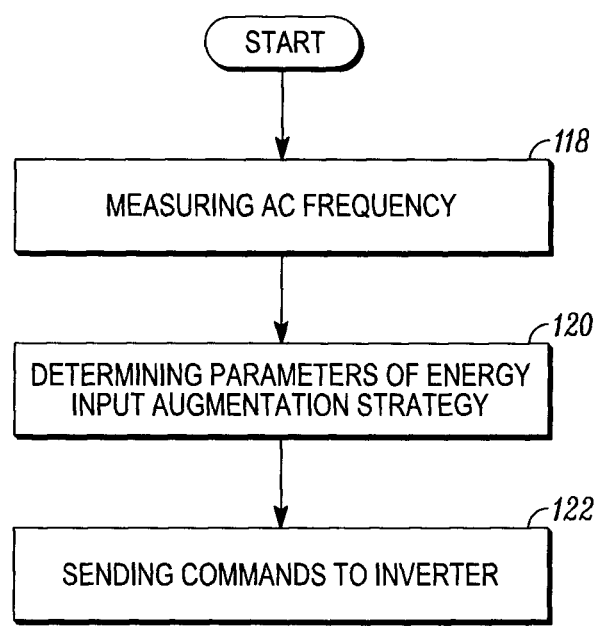
FIG. 12 is a flowchart of a process implemented by the power control device of FIG. 11 to regulate the power flow from the supplemental energy source to the AC power grid.

FIGS. 10 to 12 illustrate another example of implementation of the invention, which applies to energy transfer in the AC power grid which is controlled on the basis of the power grid frequency.

In FIG. 10, a supplemental energy source connects to the AC power grid 106 via a power control device 104. The supplemental energy source 102 is designed to supply the AC power grid 106 with electric power. Specific examples of implementation of a supplemental energy source include solar panel arrays, wind turbines and also energy storage devices. Examples of energy storage devices include flywheel banks and electrical batteries.

The supplemental energy source 102 can be a stand-alone unit, which is designed for the sole purpose of supplying the AC power grid 106 with electrical energy. Alternatively, the supplemental energy source 102 can be primarily designed to supply with electricity a dwelling and feed the AC power grid 106 only when there is excess energy available.

The supplemental energy source 102 outputs a DC voltage. The power control device 104 converts the DC voltage in an AC voltage that is synchronized with the AC waveform in the AC power grid 106. The power control device 104 regulates the power flow into the AC power grid 106 by adjusting the AC voltage impressed at the power connections between the power control device 104 and the AC power grid 106; the higher the RMS AC voltage the higher the rate of energy transfer from the supplemental energy source 102 to the AC power grid 106.

Note that the supplemental energy source 102 may generate electrical energy in AC form, rather than DC form, however for those applications a suitable conversion will be made. For instance, solar panel arrays have a DC output which most likely will require some form of conditioning to produce a stable and usable DC output. Wind turbines and flywheels, which are rotating devices, generate an AC output that will be rectified into a DC form.

FIG. 11 illustrates in greater details the structure of the power control device 104. It will be apparent that the power control device 104 is similar to the power controller 32 shown in FIG. 3, in that it includes an Input/Output (I/O) interface 107, a CPU 108 and a machine-readable storage (memory) 110. The power control device 104 also includes an inverter 112 that converts the DC input 114 from the supplemental energy source 102 to an AC waveform at its output 116 for supplying the AC power grid 106.

The inverter 112 is controlled by control signals generated from the I/O 107. In addition to receiving commands from the I/O 107 the inverter also supplies frequency information as it is observed at the output 116.

The software executed by the CPU 108 implements a process that is illustrated by the flowchart at FIG. 12. Step 118 processes the frequency information derived from the output 116. The purpose of the processing is to detect an imbalance between the generation side of the grid and the load side thereof, which is reflected by a frequency deviation. The processing can be performed in the same way as described earlier in connection with step 52 at FIG. 4 and may involve determining the rate of frequency variation, such as the speed of variation or the acceleration of the variation, which constitutes an indicator of the rate at which the kinetic energy of the AC power grid 106 is being depleted when there is a generation deficit.

Step 120 determines the parameters of an energy input augmentation strategy, which computes the rate at which electrical energy will be transferred to the AC power grid 106 by using the computations at step 118 as a factor. Generally, the higher the frequency deviation, the larger the energy injection should be in order to stabilize the frequency of the AC power grid 106. Unlike traditional power generation units, which are slow to respond, the supplemental energy source 102 can provide a nearly instantaneous burst of energy into the AC power grid 106 to slow down the frequency decrease until the main power generation units of the AC power grid 106 are able to react.

The energy injection strategy at step 120 can essentially mirror the load shedding strategy described earlier, but in reverse. For example, the slope A in FIG. 6 could be used to derive the percentage of the available energy output of the supplemental energy source 102 that is injected into the AC power grid 106. When the speed of frequency decrease is at its maximum as established by slope A, namely −0.5 Hz/sec, the inverter 112 is controlled such as to feed energy into the AC power grid 106 at the maximal rate that the supplemental energy source 102 can provide. When the speed of frequency decrease is less than −0.5 Hz/sec then the inverter 112 is commanded such that less than the maximal output is fed into the AC power grid 106.

Strategies such as those shown by the non-linear functions in FIG. 7 can also be used to determine the rate of energy injection.

Yet another possible example of energy injection strategy is to use a binary response where energy is injected at the maximal rate, when the rate of frequency variation versus time exceeds a certain degree, which is indicative of impending AC power grid collapse. This binary response strategy can be used either on its own or in combination with other energy injection strategies described earlier.

Note that in determining the rate at which energy can be injected into the AC power grid 106, the processing at step 120 needs to determine the amount of energy that the supplemental energy source 102 is actually capable of supplying. In the case of a solar array, if there is no sunlight, the array would not be able to supply much, in which case the inverter regulates whatever is available, to inject it into the AC power grid 106.

In the case of a battery or a flywheel bank, the consideration is somewhat different. Those devices can usually produce their rated output, even if the amount of energy stored is low. In other words, the rated output will be available, but the amount of time this output can be maintained depends on the degree of charge of the battery and the rotational speed of the flywheels in the bank of flywheels. Since the intent is to generate a burst of energy into the AC power grid 106, a possible approach is to tap the battery or flywheel bank such that they provide the maximal output until complete depletion.

A similar consideration exists in connection with a wind turbine. Inherently, a wind turbine is also an energy storage device because the rotor assembly builds up kinetic energy that can be tapped in emergency conditions. In one example of implementation using wind turbines as supplemental energy sources 102, the process step 120 controls the rate at which energy is taken from the wind turbine not to exceed the steady state output of the turbine, in other words without tapping into the kinetic energy reserve. However, in emergency conditions, such as when the frequency of the AC power grid 106 has significantly decreased, the kinetic energy is tapped which will cause the rotor to slow down and eventually stop.

The invention claimed is:

1. A method for regulating an electrical consumption of an equipment unit that is supplied with electrical energy by an AC power grid, the AC power grid being characterized by a dynamic state of balance between power generation and load, the method comprising:
   a. providing a power control device for managing the electrical consumption of the equipment unit;
   b. sensing, with the power control device at a location that is proximate to the equipment unit, a frequency of the electrical energy supplied by the AC power grid to the equipment unit;
   c. determining, by the power control device, a difference between the frequency of the electrical energy and a nominal frequency;
   d. determining an occurrence of a power generation deficit in the AC power grid when the difference between the frequency of the electrical energy and the nominal frequency exceeds a threshold;
   e. in response to detection of the power generation deficit within the AC power grid, implementing a power control function which includes reducing a consumption of electrical energy by the equipment unit to lessen the power generation deficit within the AC power grid, including varying the consumption by the equipment unit in a manner proportional to the difference between the frequency of the electrical energy and the nominal frequency;
   f. receiving, by the power control device over a communication network from an external entity, a command signal to prevent the power control device from triggering the power control function; and
   g. in response to receiving the command signal, by the power control device from the external entity, and determining, by the power control device, that a power generation deficit occurs in the AC power grid:
      precluding, by the power control device, implementation of the power control function including a reduction of the electrical consumption by the equipment unit.

2. The method of claim 1 further comprising: sensing the frequency of the electrical energy at a power supply connection between the equipment unit and the AC power grid.

3. The method of claim 2, wherein the command signal is issued by a utility managing an AC power distribution network.

4. The method of claim 3, wherein the command signal is generated by altering the frequency of the electrical energy supplied by the AC power grid.

5. The method of claim 1, wherein the command signal received from the external entity that is external to the power control device conveys time information.

6. The method of claim 5, wherein the time information indicates a time period during which the power control device is to withhold triggering the power control function.

7. The method of claim 1, wherein the receiving occurs in response to an occurrence of a predetermined AC power grid condition.

8. The method of claim 7, wherein the predetermined AC power grid condition is a restoration of the AC power grid following a power outage of the AC power grid.

9. The method of claim 1, further comprising:
   detecting a frequency variation from the nominal frequency of the electrical energy supplied by the AC power grid;
   repeating the detecting to obtain a plurality of frequency variations;
   comparing the plurality of frequency variations to a plurality of variation patterns, wherein a first pattern of the plurality of variation patterns corresponds to the command signal to prevent the power control device from triggering the power control function; and
   when the plurality of frequency variations matches the first pattern, recognizing the command signal to prevent the power control device from triggering the power control function.

10. The method of claim 9, wherein the repeating spans a first predetermined time duration.

11. The method of claim 10, further comprising:
   when the plurality of frequency variations does not match any of the plurality of variation patterns, continuing the repeating to span a second predetermined time duration, wherein the first and second predetermined time durations are different.

\* \* \* \* \*